United States Patent
Saha et al.

(10) Patent No.: US 7,525,136 B2
(45) Date of Patent: Apr. 28, 2009

(54) JFET DEVICE WITH VIRTUAL SOURCE AND DRAIN LINK REGIONS AND METHOD OF FABRICATION

(75) Inventors: Samar K. Saha, Milpitas, CA (US); Ashok K. Kapoor, Palo Alto, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 0 days.

(21) Appl. No.: 11/744,120

(22) Filed: May 3, 2007

(65) Prior Publication Data
US 2008/0272403 A1    Nov. 6, 2008

(51) Int. Cl.
*H01L 29/80*  (2006.01)
*H01L 31/112*  (2006.01)
(52) U.S. Cl. ................. 257/270; 257/272; 257/E27.069
(58) Field of Classification Search ................. 257/270, 257/272, E27.069
See application file for complete search history.

(56) References Cited

U.S. PATENT DOCUMENTS

| | | | |
|---|---|---|---|
| 5,559,346 A | 9/1996 | Kushida | 257/138 |
| 2004/0065896 A1 | 4/2004 | Sakamoto | 257/134 |
| 2004/0251503 A1* | 12/2004 | Hayashi et al. | 257/368 |
| 2008/0093636 A1* | 4/2008 | Vora et al. | 257/256 |

OTHER PUBLICATIONS

Patent Pending U.S. Appl. No. 12/178,770 entitled *JFET Device With Virtual Source and Drain Link Regions and Method of Fabrication* by Samar K. Saha, et al., filed Jul. 24, 2008.
Werner Buttler, et al.; *A JFET-CMOS Radiatioin-Tolerant Charge-Sensitive Preamplifier*; IEEE Journal of Solid-State Circuits; vol. 25, No. 4; XP-149253; 3 pages, Aug. 1990.
*PCT Notification of Transmittal of the International Search Report and the Written Opinion of the International Searching Authority* for International Application No. PCT/US2008/060987; 10 pages, Aug. 11, 2008.

* cited by examiner

*Primary Examiner*—Ngan Ngo
(74) *Attorney, Agent, or Firm*—Baker Botts L.L.P.

(57) ABSTRACT

A junction field effect transistor comprises a semiconductor substrate. A source region of a first conductivity type is formed in the substrate. A drain region of the first conductivity type is formed in the substrate. A channel region of the first conductivity type is formed in the substrate. A gate region of a second conductivity type is formed in the substrate between the source and drain regions. A first virtual link region is formed in the substrate between the gate region and either the source region or the drain region. A dielectric material overlays the first virtual link region. A first electrode region overlays the dielectric material.

14 Claims, 7 Drawing Sheets

JFET DEVICE WITH VIRTUAL SOURCE AND DRAIN LINK REGIONS AND METHOD OF FABRICATION

TECHNICAL FIELD OF THE INVENTION

This invention relates in general to semiconductor devices, and more particularly to a junction field effect transistor with virtual source and drain link regions.

BACKGROUND OF THE INVENTION

In prior semiconductor devices where highly doped extension regions abut or are in close proximity to a highly doped gate region, a high electric field is created at the gate/extension junctions due to applied drain voltage. This high electric field causes effects, such as band-to-band tunneling between the gate region and the extension regions. Typically, in the OFF-state of a transistor, the gate voltage is "OFF" with the drain at the supply voltage. Therefore, high-field effects like band-to-band tunneling cause leakage currents when the device is in an OFF-state. This increases the OFF-state leakage current, Ioff, of the device. This high leakage current causes higher chip standby current and power dissipation. This makes the device undesirable for particular applications.

SUMMARY OF THE INVENTION

In accordance with the present invention, the disadvantages and problems associated with prior junction field effect transistors have been substantially reduced or eliminated.

In accordance with one embodiment of the present invention, a junction field effect transistor comprises a semiconductor substrate. A source region of a first conductivity type is formed in the substrate. A drain region of the first conductivity type is formed in the substrate. A channel region of the first conductivity type is formed in the substrate. A gate region of a second conductivity type is formed in the substrate between the source and drain regions. A first virtual link region is formed in the substrate between the gate region and either the source region or the drain region. A dielectric material overlays the first virtual link region. A first electrode region overlays the dielectric material.

Another embodiment of the present invention is a method for forming a junction field effect transistor. The method comprises forming a channel region of a first conductivity type in a semiconductor substrate. The method continues by forming a layer of dielectric material, wherein the dielectric material overlays at least a first virtual link region of the semiconductor substrate. The method continues by forming a first electrode region which overlays the dielectric material. The method concludes by forming a source electrode region, a gate electrode region, and a drain electrode region overlaying the semiconductor substrate.

The following technical advantages may be achieved by some, none, or all of the embodiments of the present invention.

By including a dielectric material and an electrode region overlaying the substrate between the gate region and either or both of the source and/or drain region of the JFET, a virtual source link region and/or a virtual drain link region is formed. When the transistor is turned on, a bias voltage is applied to the electrode region(s) in order to form a high conductivity path between the channel region and either or both of the source and/or drain regions. However, when the transistor is turned off, the bias voltage is not applied and the virtual link regions remain resistive. As a result, when the transistor is turned off, the effective length of the channel region is increased. In addition, the semiconductor device reduces high electric field effects, such as band-to-band tunneling, described above. These device characteristics consequently reduce the OFF-state leakage current, Ioff, by approximately an order of magnitude over previous devices.

These and other advantages, features, and objects of the present invention will be more readily understood in view of the following detailed description, drawings, and claims.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1:
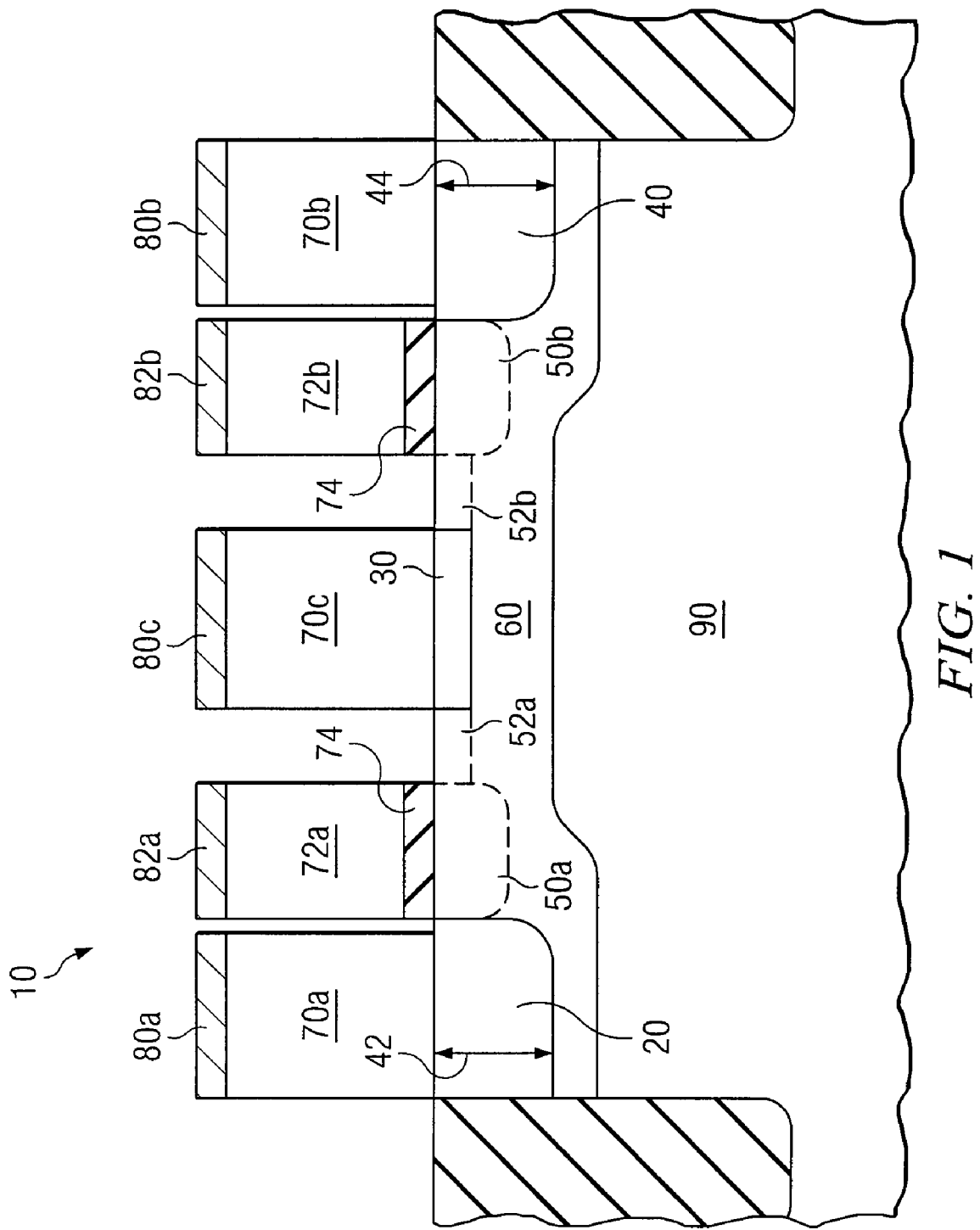
FIG. 1 illustrates a junction field effect transistor according to the present invention.

FIG. 1 illustrates a semiconductor device 10 according to a particular embodiment of the present invention. Semiconductor device 10 comprises a junction field effect transistor (JFET). As shown in FIG. 1, semiconductor device 10 includes a source region 20, a gate region 30, a drain region 40, and a channel region 60 formed in substrate 90. Polysilicon regions 70a-c and contacts 80a-c overlay source region 20, drain region 40, and gate region 30. Device 10 also includes a virtual source link region 50a formed in substrate 90 between source region 20 and channel region 60. Virtual source link region 50a may be spaced apart from gate region 30 by a gap region 52a. Device 10 further includes a virtual drain link region 50b formed in substrate 90 between drain region 40 and channel region 60. Virtual drain link region 50b may be spaced apart from gate region 30 by gap region 52b. A dielectric material 74 and corresponding polysilicon regions 72a-b and contacts 82a-b overlay virtual link regions 50a-b. These regions are not necessarily drawn to scale.

In general, when semiconductor device 10 operates in an ON-state, an appropriate bias voltage is applied to contacts 82a-b. This causes virtual source link region 50a and virtual drain link region 50b to become highly conductive, as described in detail below. When semiconductor device 10 operates in an OFF-state, however, no bias voltage is applied to contacts 82a-b. This causes virtual source link region 50a and virtual drain link region 50b to remain resistive, as described in detail below. In this regard, device 10 exhibits a reduced gate leakage current in an OFF-state of operation.

Substrate 90 represents bulk semiconductor material to which dopants can be added to form various conductivity regions (e.g., source region 20, gate region 30, drain region 40, and channel region 60). Substrate 90 may be formed of any suitable semiconductor material, such as materials from Group III and Group V of the periodic table. In particular embodiments, substrate 90 is formed of single-crystal silicon. Substrate 90 may have a particular conductivity type, such as p-type or n-type. In particular embodiments, semiconductor device 10 may represent a portion of a substrate 90 that is shared by a plurality of different semiconductor devices (not illustrated in FIG. 1).

Channel region 60 provides a path to conduct current between source region 20 and drain region 40. Channel region 60 is formed by the addition of a first type of dopant to substrate 90. For example, the first type of dopant may represent particles of n-type doping material such as antimony, arsenic, phosphorous, or any other appropriate n-type dopant. Alternatively, the first type of dopant may represent particles of p-type doping material such as boron, gallium, indium, or any other suitable p-type dopant. Where the channel region 60 is doped with n-type impurities, electrons flow from the source region 20 to the drain region 40 to create a current when an appropriate voltage is applied to device 10. Where channel region 60 is doped with p-type impurities, holes flow from the source region 20 to the drain region 40 to create a current when an appropriate voltage is applied to device 10. The doping concentration for channel region 60 may range from 1 E+18 cm$^{-3}$ to 1 E+19 cm$^{-3}$. Moreover, the doping concentration for channel region 60 may be maintained such that device 10 operates in an enhancement mode, with a current flowing between drain region 40 and source region 20 when a positive voltage differential is applied between source region 20 and gate region 30. In particular, the doping concentration of channel region 60 is lower than source region 20, drain region 40, and link regions 50a and 50b.

Source region 20 and drain region 40 each comprise regions of substrate 90 formed by the addition of the first type of dopant to substrate 90. Thus, for an n-channel device 10, source region 20 and drain region 40 are doped with n-type impurities. For a p-channel device 10, source region 20 and drain region 40 are doped with p-type impurities. In particular embodiments, source region 20 and drain region 40 have a doping concentration at or higher than 1 E+19 cm$^{-3}$.

In particular embodiments, source region 20 and drain region 40 are formed by the diffusion of dopants through corresponding polysilicon regions 70a and 70c, respectively. Consequently, in such embodiments, the boundaries and/or dimensions of source region 20 and drain region 40 may be precisely controlled. As a result, in particular embodiments, the depth of source region 20 (as indicated by arrow 42) is less than one-hundred nanometers (nm), and the depth of drain region 40 (as indicated by arrow 44) is also less than one-hundred nm. In certain embodiments, the depths of source region 20 and/or drain region 40 are between twenty and fifty nm. Because of the reduced size of source region 20 and drain region 40, particular embodiments of semiconductor device 10 may experience less parasitic capacitance during operation, thereby allowing semiconductor device 10 to function with a lower operating voltage.

Gate region 30 is formed by doping substrate 90 with a second type of dopant. As a result, gate region 30 has a second conductivity type. Thus, for an n-channel device 10, gate region 30 is doped with p-type impurities. For a p-channel device 10, gate region 30 is doped with n-type impurities. In particular embodiments, gate region 30 is doped with the second type of dopant to a concentration at or higher than 1 E+19 cm$^{-3}$. As described further below, when a voltage is applied to gate region 30, the applied voltage alters the conductivity of the neighboring channel region 60, thereby facilitating or impeding the flow of current between source region 20 and drain region 40. Although FIG. 1 illustrates an embodiment of semiconductor device 10 that includes only a single gate region 30, alternative embodiments may include multiple gate regions 30. As with regions 20 and 40, gate region 30 may be formed by diffusing dopants from a corresponding polysilicon region 70c.

Polysilicon regions 70a-c comprise polysilicon structures that provide an ohmic connection between contacts 80a-c and source region 20, drain region 40, and gate region 30, respectively. In particular embodiments, polysilicon regions 70 may connect pins of an integrated circuit package to the various regions of semiconductor device 10. Furthermore, in particular embodiments, source region 20, drain region 40, and gate region 30 are formed by dopants that are diffused through polysilicon regions 70. As a result, in particular embodiments, polysilicon regions 70 may themselves comprise doped material, even after any appropriate diffusion of dopants into the various regions of substrate 90 has occurred.

Additionally, in particular embodiments, polysilicon regions 70 may be coplanar. Moreover, in particular embodiments, contacts 80 may additionally or alternatively be coplanar so that particular surfaces of all contacts 80 have the same height. Coplanar polysilicon regions 70 and/or contacts 80 may simplify the manufacturing and packaging of semiconductor device 10.

Virtual link regions 50a and 50b comprise regions of substrate 90 formed by doping substrate 90 with n-type or p-type impurities, as appropriate, or by leaving these regions undoped. A dielectric material 74 and corresponding electrode regions 72a-b and contacts 82a-b overlay virtual link regions 50a-b. The dielectric material 74 may comprise oxide. Electrode regions 72a-b may comprise polysilicon. Contacts 80a-b may comprise metal interconnects to which a bias voltage may be applied.

Gap region 52a comprises a region of semiconductor substrate 90 that separates virtual link region 50a from gate region 30. Gap region 52b comprises a region of semiconductor substrate 90 that separates virtual link region 50b from gate region 30. In a particular embodiment, gap regions 52a-b may comprise a portion of channel region 60. The doping concentrations of gap regions 52a-b are generally at least an order of magnitude less than the doping concentration of source region 20 and drain region 40, respectively. Thus, the doping concentration of gap regions 52a-b can range from no doping or very low doping concentrations to up to 10 E+18 cm$^{-3}$.

In operation, channel region 60 provides a voltage-controlled conductivity path between source region 20 and drain region 40 through link regions 50. More specifically, a voltage differential between gate region 30 and source region 20 (referred to herein as $V_{GS}$) controls channel regions 60 by increasing or decreasing a width of a depletion region formed within channel region 60. The depletion region defines an area within channel region 60 in which the recombination of holes and electrons has depleted semiconductor device 10 of charge carriers. Because the depletion region lacks charge carriers, it will impede the flow of current between source region 20 and drain region 40. Moreover, as the depletion region expands or recedes, the portion of channel regions 60 through which current can flow grows or shrinks, respectively. As a result, the conductivity of channel region 60 increases and decreases as $V_{GS}$ changes, and semiconductor device 10 may operate as a voltage-controlled current regulator.

Furthermore, in particular embodiments, semiconductor device 10 comprises an enhancement mode device. Thus, when $V_{GS}$ is highly reverse biased, the depletion region pinches off channel regions 60 preventing current from flowing between source region 20 and drain region 40. When $V_{GS}$ is highly forward biased, the depletion region recedes to a point that a current flows between source region 20 and drain region 40 through link regions 50 and channel region 60 when a positive voltage differential is applied between source region 20 and drain region 40 (referred to herein as $V_{DS}$).

Overall, in particular embodiments, the dimensions of channel region 60, gate region 30, source region 20, and/or drain region 40 may reduce the parasitic capacitances created within semiconductor device 10 and may, as a result, allow semiconductor device 10 to operate with reduced drive current. As a result, one or more semiconductors can be combined onto a microchip to form a memory device, processor, or other appropriate electronic device that is capable of functioning with a reduced operational voltage. For example, in particular embodiments of semiconductor device 10, channel region 60 may conduct current between source region 20 and drain region 40 with a $V_{GS}$ having a magnitude of about 0.5V. Consequently, electronic devices that include semiconductor device 10 may be capable of operating at higher speed and with lower power consumption than conventional semiconductor devices.

In addition to applying a voltage, $V_{GS}$, to device 10, a separate bias voltage may be applied to contacts 80a-b in order to control the operational characteristics of virtual link regions 50a-b. Four different sets of conditions are provided below together with the corresponding operational characteristics of device 10.

The first set of conditions assumes that device 10 includes a p-type substrate 90, an n-type source region 20, an n-type drain region 40, an n-type channel region 60, and n-type virtual link regions 50a-b under oxide layers 74. For this set of conditions, a positive bias voltage applied to polysilicon region 72a and 72b will generate an electric field that causes electrons (negative charge) to accumulate under the oxide layers 74. This accumulation of electrons will create a highly conductive path between source region 20 and channel region 60 through virtual source link 50a; and will create a highly conductive path between drain region 40 and channel region 60 through virtual drain link region 50b. The amount of the bias voltage applied to create these highly conductive paths depends on the oxide thickness. For an oxide thickness between 1 to 3 nm, an applied bias voltage of 0.5 volts or greater is sufficient.

The second set of conditions assumes that device 10 includes an n-type substrate 90, a p-type source region 20, a p-type drain region 40, a p-type channel region 60, and p-type virtual link regions 50a-b under oxide layers 74. For this set of conditions, a negative bias voltage applied to polysilicon region 72a and 72b will generate an electric field that causes holes (positive charge) to accumulate under the oxide layers 74. This accumulation of holes will create a highly conductive path between source region 20 and channel region 60 through virtual source link 50a; and will create a highly conductive path between drain region 40 and channel region 60 through virtual drain link region 50b.

The third set of conditions assumes that device 10 includes a p-type substrate 90, an n-type source region 20, an n-type drain region 40, an n-type channel region 60, and undoped or lightly p-type virtual link regions 50a-b under oxide layers 74. For this set of conditions, a positive bias voltage applied to n-type doped polysilicon regions 72a and 72b will generate an electric field that causes an inversion layer of electrons (negative charge) to form under the oxide layers 74. This inversion layer of electrons creates a highly conductive path between source region 20 and channel region 60 through virtual source link 50a; and creates a highly conductive path between drain region 40 and channel region 60 through virtual drain link region 50b.

The fourth set of conditions assumes that device 10 includes an n-type substrate 90, a p-type source region 20, a p-type drain region 40, a p-type channel region 60, and undoped or lightly n-type virtual link regions 50a-b under oxide layers 74. For this set of conditions, a negative bias voltage applied to p-type doped polysilicon regions 72a and 72b will generate an electric field that causes an inversion layer of holes (positive charge) to form under the oxide layers 74. This inversion layer of holes creates a highly conductive path between source region 20 and channel region 60 through virtual source link 50a; and creates a highly conductive path between drain region 40 and channel region 60 through virtual drain link region 50b.

Regardless of which of the four sets of conditions is assumed for device 10, when device 10 is turned off, the bias voltage is not applied to polysilicon regions 72a-b. As a result, virtual link regions 50a-b do not form highly conductive paths between source region 20, channel region 60 and drain region 40. Instead, the virtual link regions 50a-b remain resistive. As a result, when the transistor is turned off, the resistive virtual link regions 50a-b reduce high electric field effects, such as band-to-band tunneling, described above. By spacing apart virtual link regions 50a-b from gate region 30 using gap regions 52a and 52b, respectively, device 10 further reduces the effects of band-to-band tunneling described above. In addition to reducing the effects of band-to-band tunneling, by providing virtual link regions 50a-b, the effective length of the channel region 60 is increased during an OFF-state of operation for semiconductor device 10. These device characteristics consequently reduce the OFF-state leakage current, Ioff, by approximately an order of magnitude over previous devices. Thus, the ratio of Ion to Ioff is increased.

Figure 2:
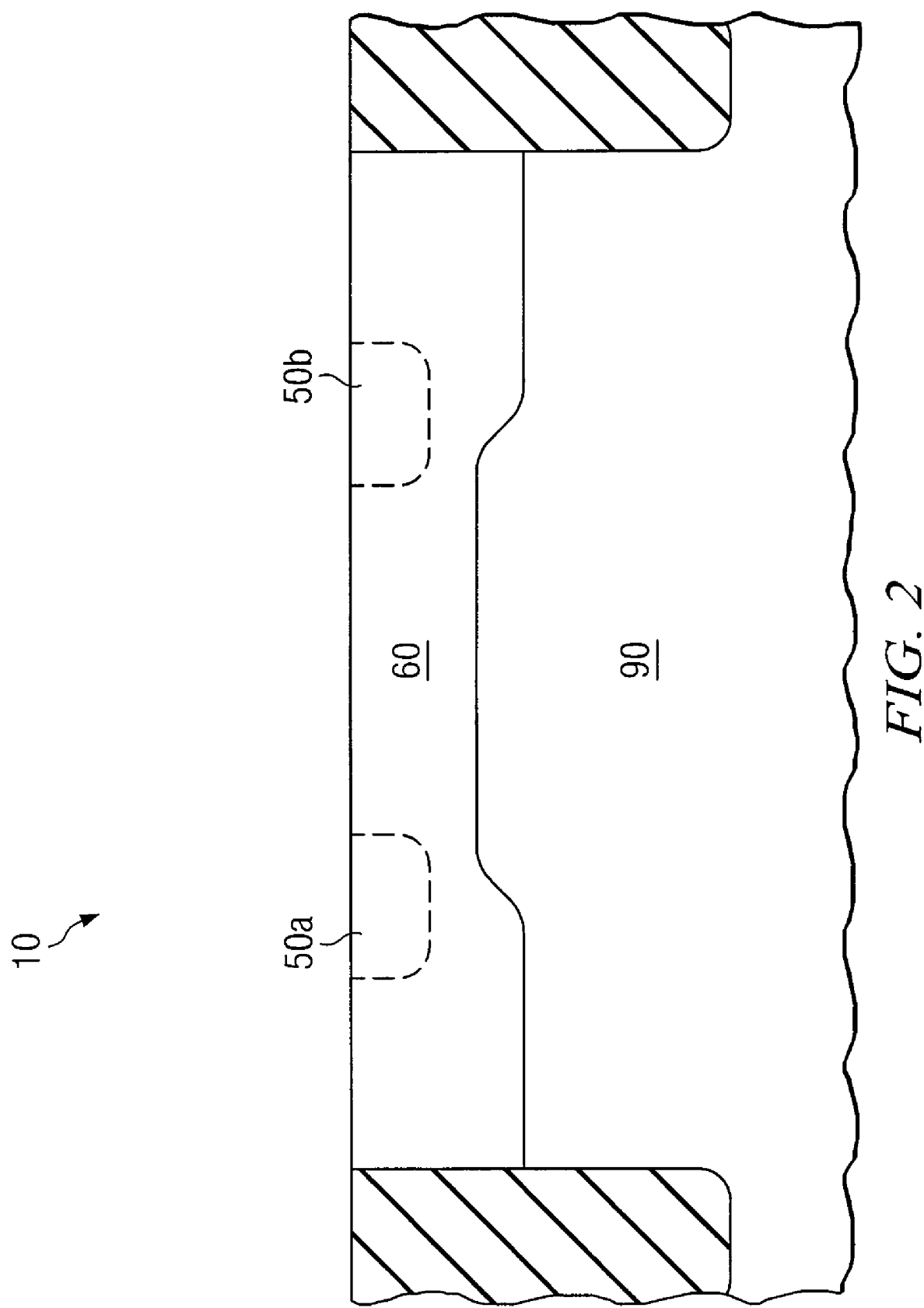
FIGS. 2-7 illustrate one embodiment of a method for fabricating a junction field effect transistor according to the present invention.

FIG. 2 shows a cross sectional view of semiconductor device 10 after particular steps during the fabrication have been completed to form the channel region 60. The various elements of the semiconductor device described in FIGS. 2-7 are not necessarily drawn to scale. FIG. 2 also illustrates virtual source link region 50a and virtual drain link region 50b. In one embodiment, the doping type of regions 50a-b is the same doping type as that of channel region 60, but with a lower doping concentration. In this embodiment, device 10 operates by creating an accumulation layer of charge carriers as set forth above in the first and second set of conditions. In another embodiment, regions 50a-b are undoped or have the opposite doping type as that of channel region 60. In this embodiment, device 10 operates by creating an inversion layer of charge carriers as set forth above in the third and fourth set of conditions. The remaining description of the fabrication of device 10 can be implemented for either of these embodiments.

Figure 3:
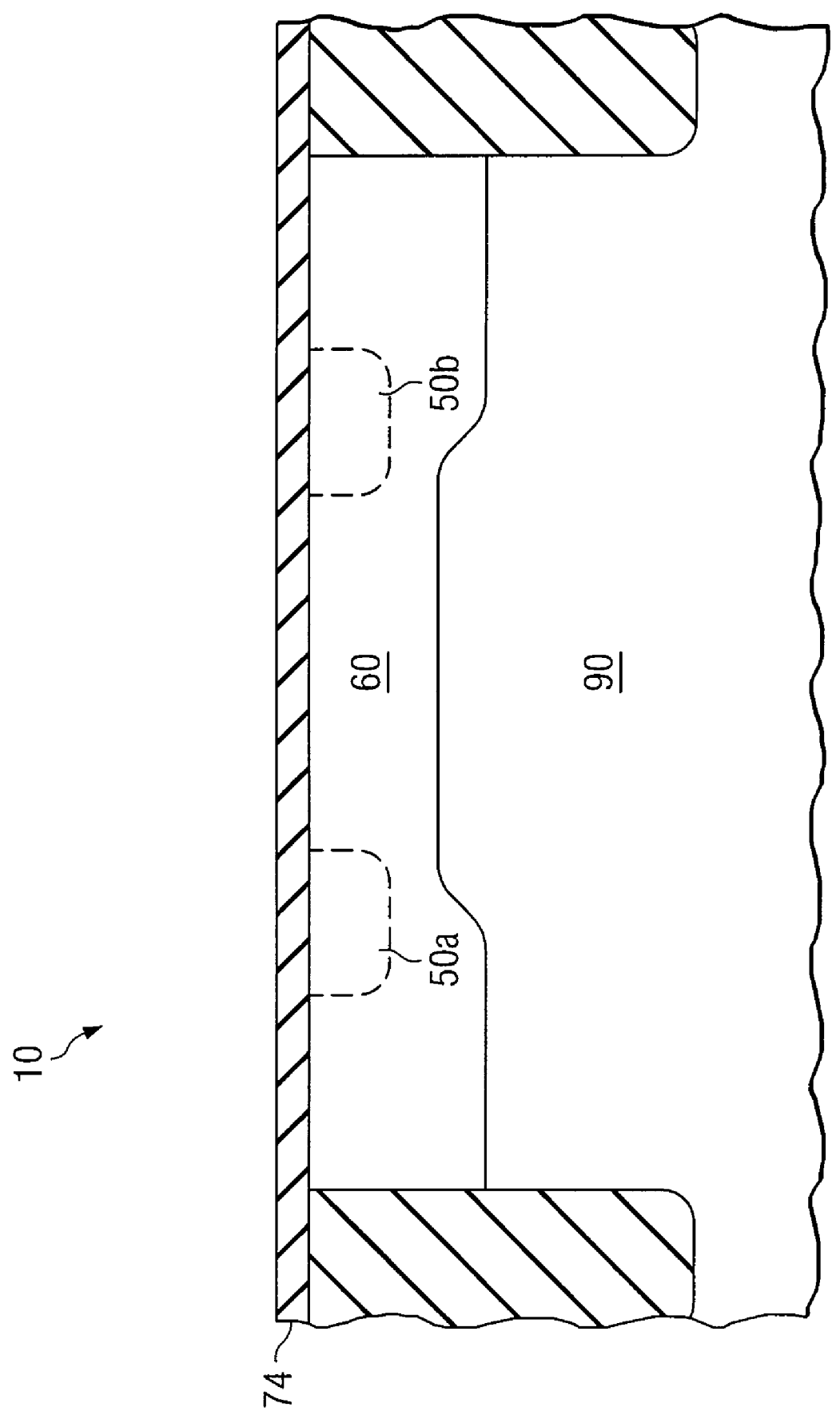

FIG. 3 illustrates the formation of a layer of dielectric material 74 that is deposited on the top of the entire structure. In one embodiment, dielectric material 74 comprises oxide. Dielectric material 74 is formed through methods including, but not limited to, rapid thermal oxidation (RTO), chemical vapor deposition (CVD), wet oxidation, or other dielectric-growing technologies. Dielectric material 74 may have a thickness between about 1-3 nm.

Figure 4:
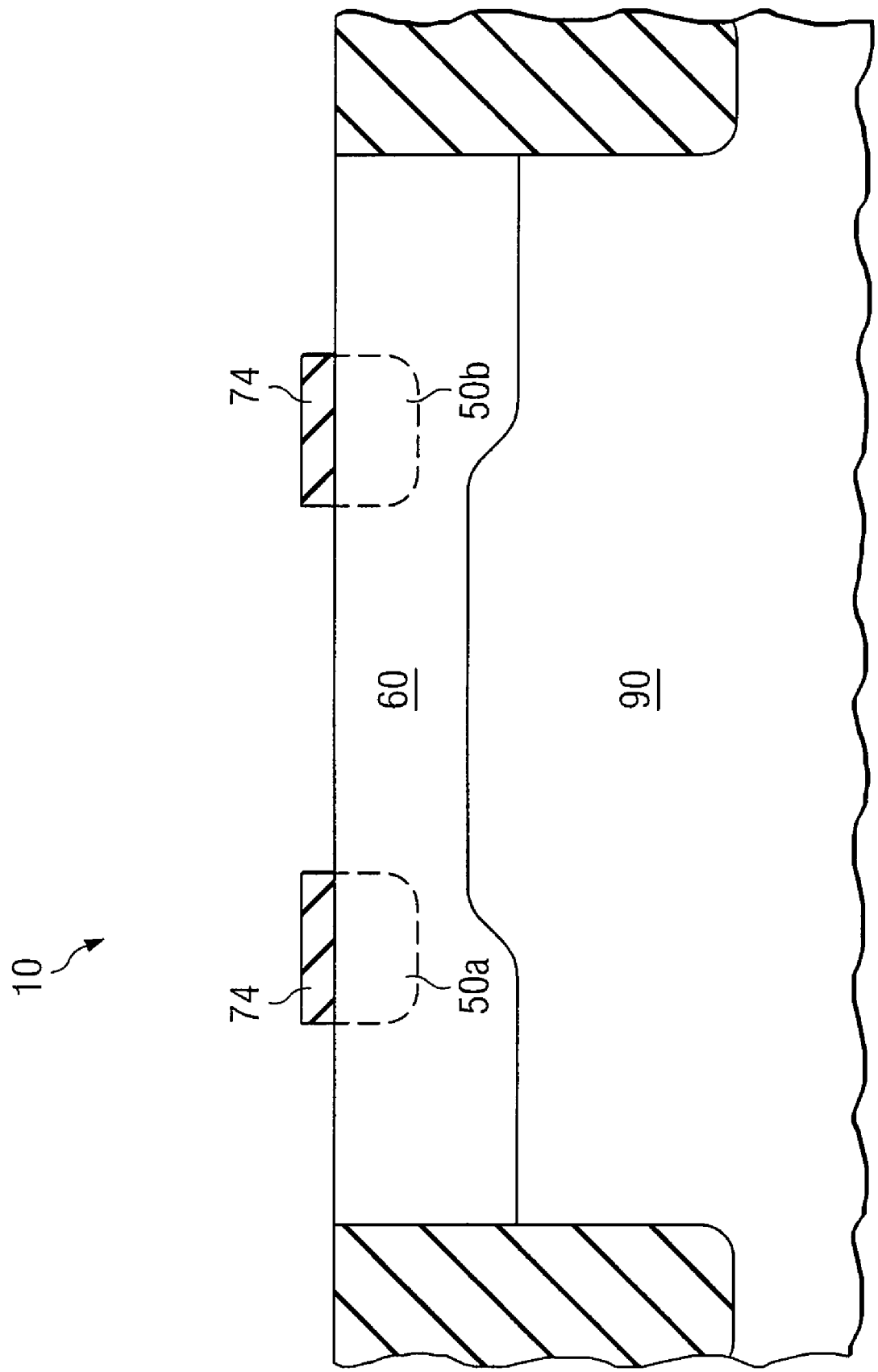

In FIG. 4, dielectric material 74 is etched back to expose particular portions of substrate 90. Dielectric material 74 remains overlaying the virtual source link region 50a and the virtual drain link region 50b. Certain portions of dielectric material 74 are etched using any suitable etching process, including but not limited to a wet etch, dry etch, anisotropic etch, isotropic etch, RIE (Reactive Ion Etching), or plasma etch.

Figure 5:
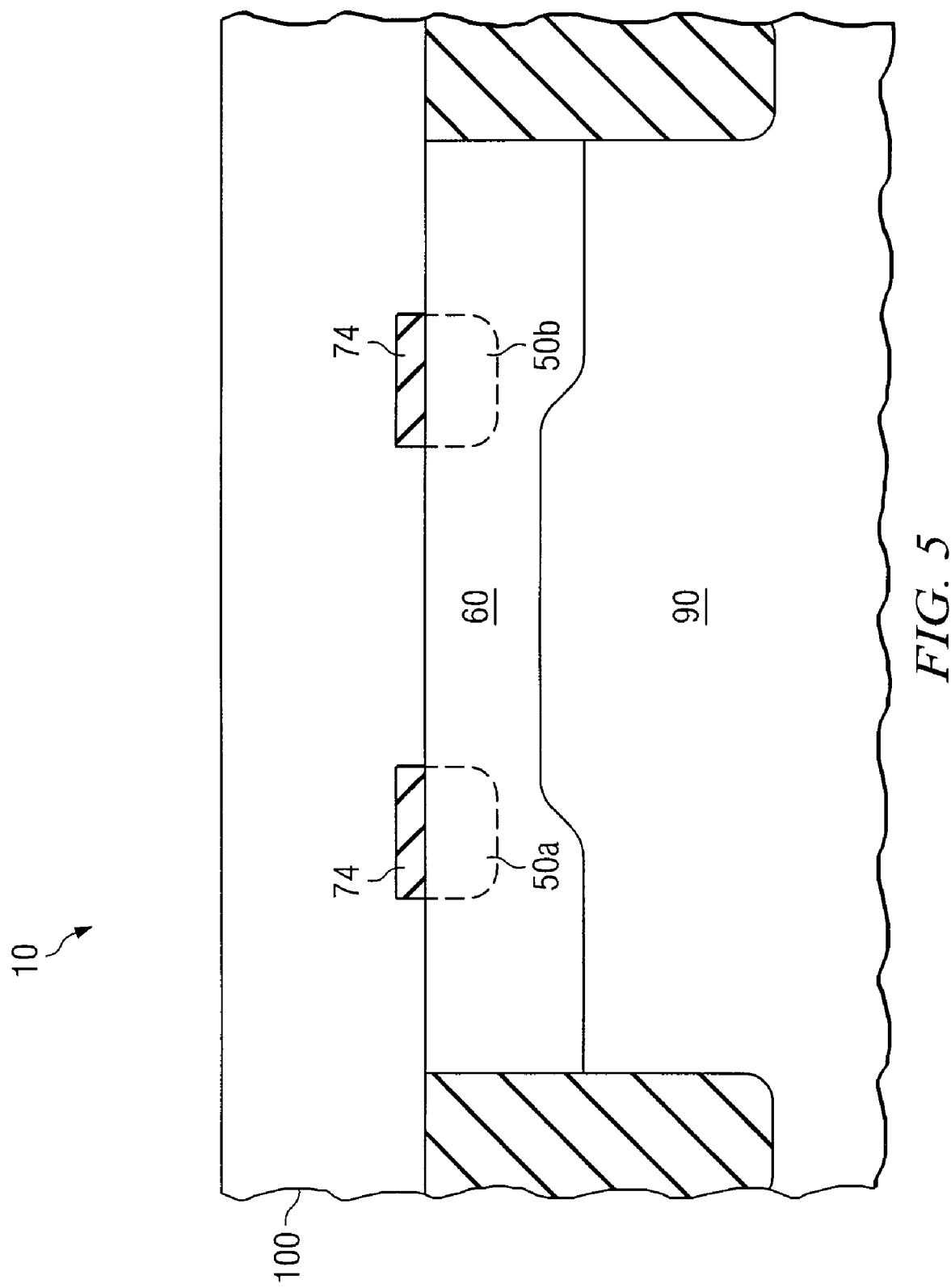
Figure 6:
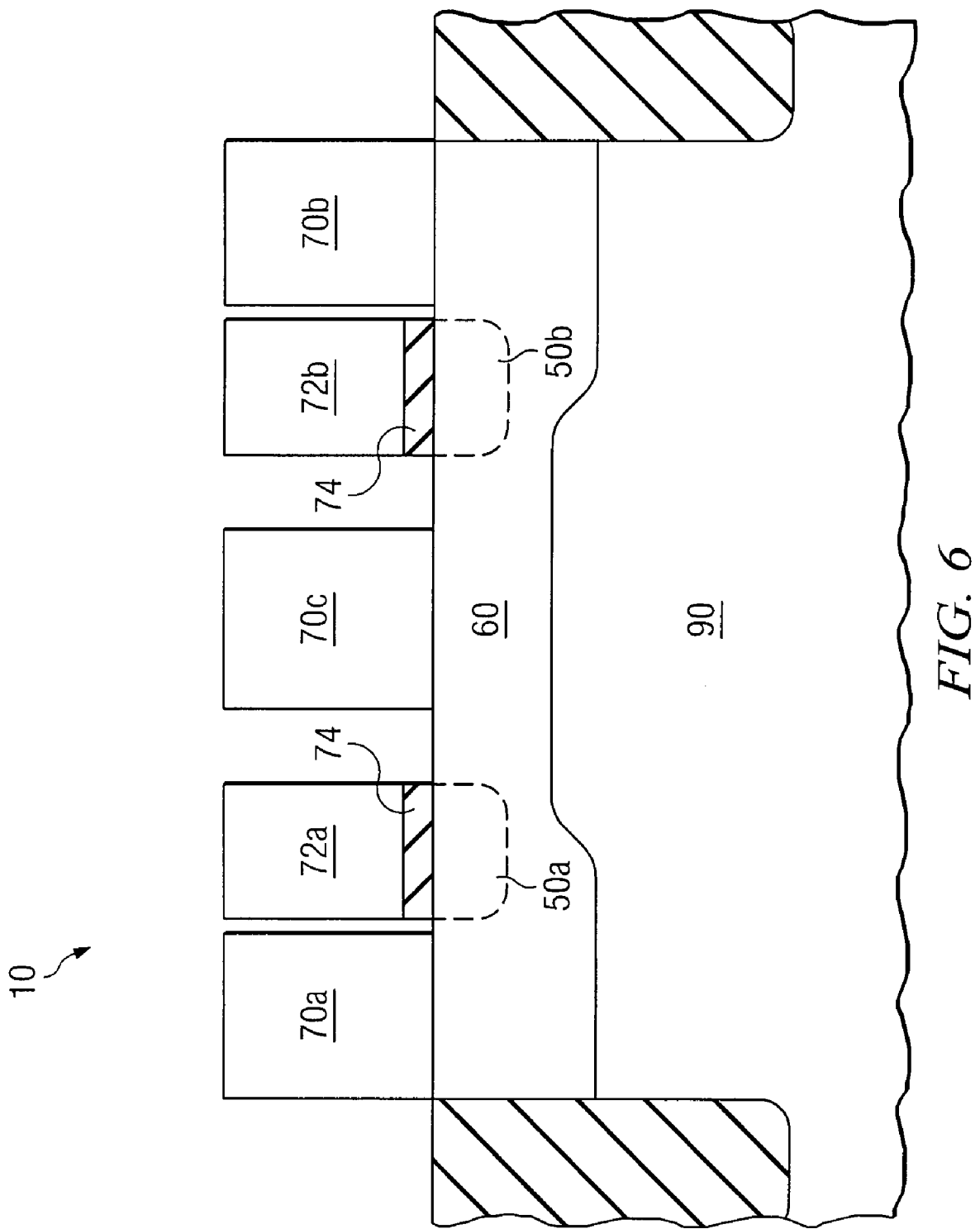

FIG. 5 illustrates the deposition of polycrystalline silicon 100 that will be used to form the polysilicon regions of device 10. The polysilicon 100 may be doped using any suitable technique, such as diffusion, ion implantation, or in-situ doping. For example, when device 10 is constructed using an n-type channel region 60, then the polysilicon may be selectively doped using n-type impurities. When device 10 is constructed using an p-type channel region 60, then the polysilicon may be selectively doped using p-type impurities. In FIG. 6, any suitable selective etching process may be used to remove portions of polysilicon 100 in order to form polysilicon regions 70a-c and 72a-b. The selective etching process may involve forming a suitable mask in order to expose the appropriate portions of polysilicon 100 during the etching process.

Figure 7:
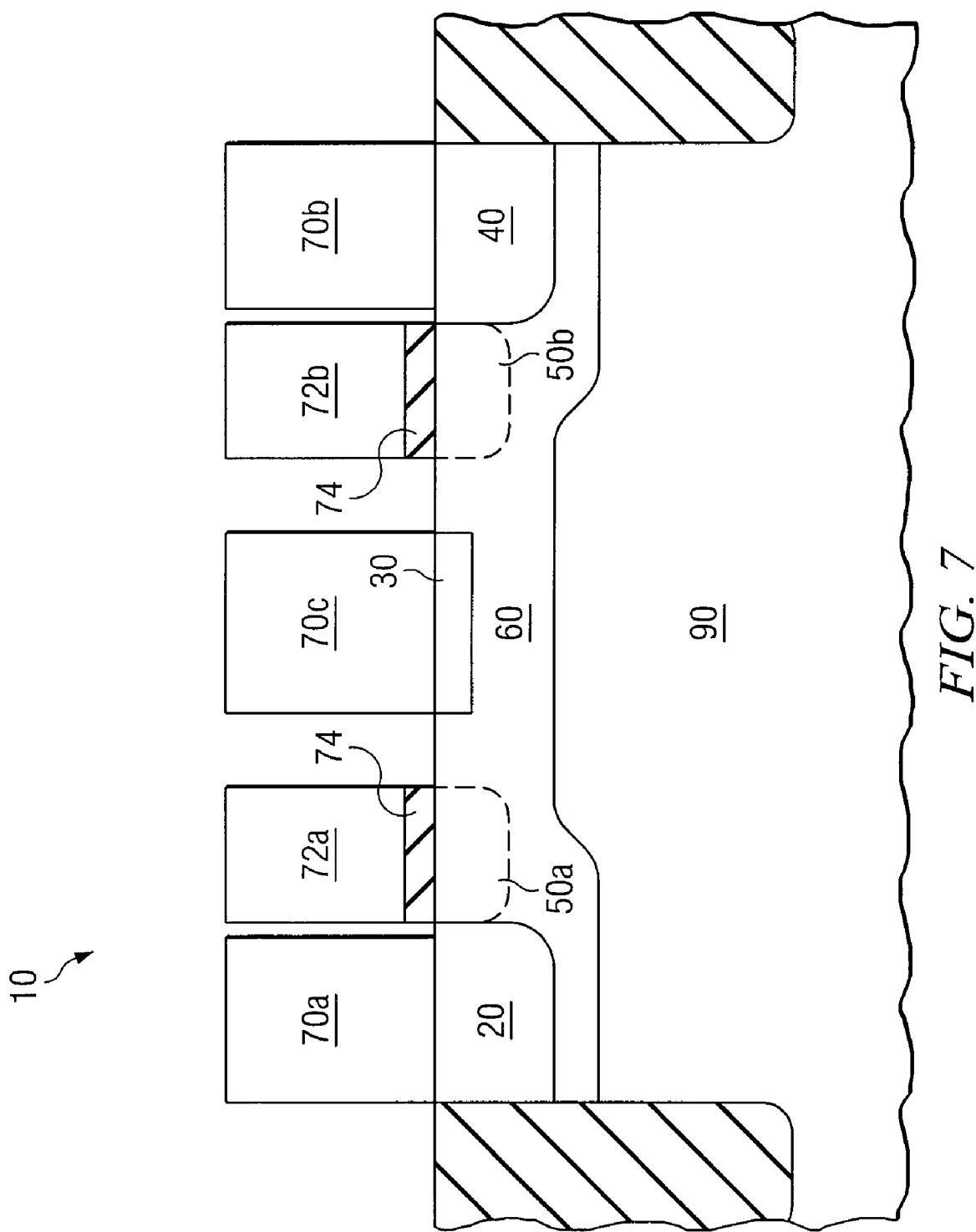

FIG. 7 illustrates the formation of source region 20, gate region 30, and gate region 40. In contrast to metal-oxide-semiconductor field-effect transistors (MOSFETs), semiconductor device 10 does not include any dielectric material 74 covering the area in which gate region 30, source region 20, or drain region 40 are to be formed. As a result, in particular embodiments, these regions may be formed by the diffusion of dopants through a corresponding polysilicon region 70. For example, source region 20 may be formed by the diffusion of dopants through polysilicon region 70a. Drain region 40 may be formed by the diffusion of dopants through polysilicon region 70b. Gate region 30 may be formed by the diffusion of dopants through polysilicon region 70c. Consequently, in such embodiments, the boundaries and/or dimensions of region 20, 30, and/or 40 may be precisely controlled. From here, the remainder of semiconductor device 10 is formed using suitable fabrication techniques. For example, at least the contact patterning and formation process, and the metal interconnect formation process also takes place.

Although the present invention has been described in detail, it should be understood that various changes, substitutions and alterations can be made hereto without departing from the sphere and scope of the invention as defined by the appended claims.

What is claimed is:

1. A junction field effect transistor, comprising:
 a semiconductor substrate;
 a source region of a first conductivity type which is formed in the substrate;
 a drain region of the first conductivity type which is formed in the substrate;
 a channel region of the first conductivity type which is formed in the substrate;
 a gate region of a second conductivity type formed in the substrate between the source and drain regions;
 a first virtual link region formed in the substrate between the gate region and either the source region or the drain region;
 a dielectric material which overlays the first virtual link region; and
 a first electrode region which overlays the dielectric material;
 wherein the first electrode region is operable to receive a bias voltage such that an inversion layer of impurities of the first conductivity type forms in the first virtual link region.

2. A junction field effect transistor, comprising:
 a semiconductor substrate;
 a source region of a first conductivity type which is formed in the substrate;
 a drain region of the first conductivity type which is formed in the substrate;
 a channel region of the first conductivity type which is formed in the substrate;
 a gate region of a second conductivity type formed in the substrate between the source and drain regions;
 a first virtual link region formed in the substrate between the gate region and either the source region or the drain region, the first virtual link region of the first conductivity type;
 a dielectric material which overlays the first virtual link region;
 a first electrode region which overlays the dielectric material; and
 a gap region formed between the first virtual link region and the gate region;
 wherein the first electrode region is operable to receive a bias voltage such that an accumulation layer of impurities of the first conductivity type forms in the first virtual link region.

3. The junction field effect transistor of claim 2, wherein:
 the first conductivity type comprises n-type and the bias voltage comprises a positive bias voltage; or
 the first conductivity type comprises p-type and the bias voltage comprises a negative bias voltage.

4. The junction field effect transistor of claim 2, wherein:
 the bias voltage is applied when the transistor is in an ON-state; and
 the bias voltage is not applied when the transistor is in an OFF-state.

5. The junction field effect transistor of claim 2, wherein the accumulation layer of impurities forms a high conductivity path between the channel region and either the source region or the drain region.

6. The junction field effect transistor of claim 1, further comprising a gap region formed between the first virtual link region and the gate region.

7. The junction field effect transistor of claim 1, wherein the first virtual link region is either undoped or doped with impurities of the second conductivity type.

8. The junction field effect transistor of claim 1, wherein:
 the first conductivity type comprises n-type and the bias voltage comprises a positive bias voltage; or
 the first conductivity type comprises p-type and the bias voltage comprises a negative bias voltage.

9. The junction field effect transistor of claim 1, wherein:
 the bias voltage is applied when the transistor is in an ON-state; and
 the bias voltage is not applied when the transistor is in an OFF-state.

10. The junction field effect transistor of claim 1, wherein the inversion layer of impurities forms a high conductivity path between the channel region and either the source region or the drain region.

11. The junction field effect transistor of claim 1, further comprising:
 a gate electrode region of a second conductivity type which overlays the semiconductor substrate; and
 a gate contact region formed on the gate electrode region and in ohmic contact with the gate region.

12. The junction field effect transistor of claim 1, further comprising:
 a second virtual link region formed in the substrate between the gate region and the other of the source region or the drain region;
 a dielectric material which overlays the second virtual link region; and
 a second electrode region which overlays the dielectric material.

13. The junction field effect transistor of claim 1, wherein:
 the dielectric material comprises oxide; and
 the first gate electrode region comprises polysilicon.

14. A junction field effect transistor, comprising:
 a semiconductor substrate;
 a source region of a first conductivity type which is formed in the substrate;

a drain region of the first conductivity type which is formed in the substrate;
a channel region of the first conductivity type which is formed in the substrate;
a gate region of a second conductivity type formed in the substrate between the source and drain regions;
a first virtual link region formed in the substrate between the gate region and the source region;
a dielectric material which overlays the first virtual link region;
a first electrode region which overlays the dielectric material;
a second virtual link region formed in the substrate between the gate region and the drain region;
a dielectric material which overlays the second virtual link region;
a second electrode region which overlays the dielectric material; and
wherein the first electrode region is operable to receive a bias voltage such that an inversion layer of impurities of the first conductivity type forms in the first virtual link region.

* * * * *